United States Patent
Gardner et al.

[19]

[11] Patent Number: 5,923,984
[45] Date of Patent: Jul. 13, 1999

[54] METHOD OF MAKING ENHANCEMENT-MODE AND DEPLETION-MODE IGFETS WITH DIFFERENT GATE MATERIALS

[75] Inventors: Mark I. Gardner, Cedar Creek; Frederick N. Hause, Austin, both of Tex.

[73] Assignee: Advanced Micro Devices, Inc., Sunnyvale, Calif.

[21] Appl. No.: 08/844,923

[22] Filed: Apr. 21, 1997

[51] Int. Cl.$^6$ ................................................. H01L 21/336
[52] U.S. Cl. .......................................... 438/289; 438/291
[58] Field of Search ................................... 438/289–291, 438/275–279

[56] References Cited

U.S. PATENT DOCUMENTS

| | | | |
|---|---|---|---|
| 4,085,498 | 4/1978 | Rideout | 29/571 |
| 4,329,186 | 5/1982 | Kotecha et al. | 148/1.5 |
| 4,682,404 | 7/1987 | Miller et al. | 29/571 |
| 4,725,871 | 2/1988 | Yamazaki | 357/23.12 |
| 5,254,487 | 10/1993 | Tamagawa . | |
| 5,300,443 | 4/1994 | Shimabukuro et al. | 437/34 |
| 5,580,815 | 12/1996 | Hsu et al. | 437/69 |

OTHER PUBLICATIONS

Silicon Processing for the VLSI Era—vol. 3: The Submicron MOSFET, by S. Wolf, published by Lattice Press, Sunset Beach, CA, 1995, pp. 641–643.

Silicon Processing for the VLSI Era—vol. 1: Process Technology, by S. Wolf, published by Lattice Press, Sunset Beach, CA, 1986, pp. 175–181 and 295–308.

Silicon Processing for the VLSI Era—vol. 2: Process Integration, by S. Wolf, published by Lattice Press, Sunset Beach, CA, 1990, pp. 516–519.

Solid State Electronic Devices—Fourth Edition, by Ben G. Streetman, published by Prentice Hall, Englewood Cliffs, New Jersey, 1995, pp. 359–361.

Silicon Processsing for the VLSI Era—vol. 3: The Submicron MOSFET, by S. Wolf, published by Lattice Press, Sunset Beach, CA, 1995, pp. 554–555.

*Primary Examiner*—Jey Tsai
*Attorney, Agent, or Firm*—Skjerven, Morrill, MacPherson, Franklin & Friel LLP

[57] ABSTRACT

A method of making enhancement-mode and depletion-mode IGFETs with different gate materials is disclosed. The method includes providing a semiconductor substrate with first and second device regions, forming a first gate composed of a first gate material over the first device region, forming a second gate composed of a second gate material over the second device region, implanting a dopant into the substrate and into the first and second gates to implant source and drain regions in the first device region and source and drain regions in the second device region, and transferring the dopant through the first gate into a first channel region in the first device region beneath the first gate without transferring essentially any of the dopant through the second gate into a second channel region in the second device region beneath the second gate, thereby providing depletion-mode doping in the first channel region while retaining enhancement-mode doping in the second channel region. The dopant can be implanted through the first gate into the first channel region. Alternatively, the dopant can be implanted into the first gate but not the first channel region and then diffused from the first gate into the first channel region. Advantageously, by employing different gate materials, a single implant step can be used to provide lightly doped source/drain regions for enhancement and depletion-mode IGFETs as well as depletion-mode doping for channel regions of depletion-mode IGFETs (with gates composed of the first gate material) while retaining enhancement-mode doping for channel regions of enhancement-mode IGFETs (with gates composed of the second gate material).

38 Claims, 8 Drawing Sheets

METHOD OF MAKING ENHANCEMENT-MODE AND DEPLETION-MODE IGFETS WITH DIFFERENT GATE MATERIALS

BACKGROUND OF THE INVENTION

FIELD OF THE INVENTION

The present invention relates to integrated circuit manufacturing, and more particularly to insulated-gate field-effect transistors.

DESCRIPTION OF RELATED ART

An insulated-gate field-effect transistor (IGFET), such as a metal-oxide semiconductor field-effect transistor (MOSFET), uses a gate to control an underlying surface channel joining a source and a drain. The channel, source and drain are located in a semiconductor substrate, with the source and drain being doped oppositely to the substrate. The gate is separated from the semiconductor substrate by a thin insulating layer such as a gate oxide. The operation of the IGFET involves application of an input voltage to the gate, which sets up a transverse electric field in order to modulate the longitudinal conductance of the channel.

Polysilicon (also called polycrystalline silicon, poly-Si or poly) thin films have many important uses in IGFET technology. One of the key innovations is the use of heavily doped polysilicon in place of aluminum as the gate. Since polysilicon has the same high melting point as a silicon substrate, typically a blanket polysilicon layer is deposited prior to source and drain formation, and the polysilicon is anisotropically etched to provide a gate. Thereafter, the gate provides an implant mask during the formation of source and drain regions by ion implantation, and the implanted dopants are driven-in and activated using a high-temperature anneal that would otherwise melt the aluminum.

An important parameter in IGFETs is the threshold voltage ($V_T$), which is the minimum gate voltage required to induce the channel. In general, the positive gate voltage of an N-channel device must be larger than some threshold voltage before a conducting channel is induced, and the negative gate voltage of a P-channel device must be more negative than some threshold voltage to induce the required positive charge (mobile holes) in the channel. There are, however, exceptions to this general rule. For example, depletion-mode devices already have a channel with zero gate voltage, and therefore are normally on. With N-channel depletion-mode devices a negative gate voltage is required to turn the devices off, and with P-channel depletion-mode devices a positive gate voltage is required to turn the devices off.

Depletion-mode devices are often used as nonlinear load circuits to provide a more favorable current-voltage relationship than is possible with linear load circuits using resistors or enhancement-mode devices. Enhancement-mode devices are often used as switches in digital circuits to prevent or allow the flow of electrical currents.

Enhancement-mode and depletion-mode devices are often fabricated on the same semiconductor substrate or chip to provide an integrated circuit such as a microprocessor. An array of devices can be fabricated in an integrated circuit layout, with some adjusted by implantation to obtain the desired enhancement-mode doping and others implanted to become depletion loads. A separate implantation step is typically used to provide some channel regions with depletion-mode doping while others retain enhancement-mode doping.

For example, prior to gate oxide formation, a masking layer can cover the device regions intended for enhancement-mode devices while providing openings over device regions intended for depletion-mode devices, and then the structure can be subjected to ion implantation so that only the exposed device regions are provided with depletion-mode doping.

Alternatively, after-gate implantations (such as wells, channel-stop doping, $V_T$ control, source/drain, etc.) can be used to provide depletion-mode doping after the gates are patterned. Studies indicate that after-gate implantations do not degrade the gate oxide integrity or the device characteristics. For example, U.S. Pat. No. 4,329,186 to Kotecha et al. discloses a technique for forming enhancement-mode and depletion-mode devices, in which after the gates are formed, a photoresist layer is patterned to cover some gates and expose other gates, and then ions are implanted through the exposed gates directly into the underlying channel regions to provide depletion-mode doping in these channel regions. Since the photoresist layer provides an implant mask, the channel regions underlying the gates covered by the photoresist layer retain enhancement-mode doping.

A drawback to these approaches, however, is that a separate implantation step is required to provide depletion-mode doping in selected channel regions.

A problem encountered in P-channel devices with polysilicon gates containing a high concentration of boron is that when a thin gate oxide is used, poor $V_T$ control may arise due to unwanted boron penetration into the gate oxide, or further, into the underlying channel region. It is reported that boron will penetrate gate oxides that are less than 125 angstroms thick during a 900° C. 30-minute post-implant anneal in nitrogen. It has also been found that the presence of fluorine in the gate oxide worsens the boron penetration problem. Such fluorine can be introduced into the gate oxide if boron difluoride ($BF_2$) is the implant species. Unfortunately, in some instances, the boron penetration may be sufficiently large to provide depletion-mode doping in channel regions intended for enhancement-mode devices.

Accordingly, a need exists for an improved method of making enhancement-mode and depletion-mode IGFETs in the desired device regions that reduces the number of implant steps.

SUMMARY OF THE INVENTION

An object of the present invention is provide an improved method of making enhancement-mode and depletion-mode IGFETs. A dopant from a single implant step provides source/drain doping for the enhancement-mode and depletion-mode devices as well as depletion-mode doping for a channel region of the depletion-mode device. This is accomplished using a first gate composed of a first material for the depletion-mode device and a second gate composed of a second material for the enhancement-mode device. The dopant is transferred through the first gate to provide depletion-mode doping in the underlying channel region, whereas essentially none of the dopant is transferred through the second gate to retain enhancement-mode doping in the underlying channel region.

In accordance with one aspect of the invention, a method of making enhancement-mode and depletion-mode IGFETs includes providing a semiconductor substrate with first and second device regions, forming a first gate composed of a first gate material over the first device region, forming a second gate composed of a second gate material over the second device region, implanting a dopant into the substrate and into the first and second gates to implant source and drain regions in the first device region and source and drain regions in the second device region, and transferring the dopant through the first gate into a first channel region in the first device region beneath the first gate without transferring essentially any of the dopant through the second gate into a second channel region in the second device region beneath the second gate, thereby providing depletion-mode doping in the first channel region while retaining enhancement-mode doping in the second channel region.

The dopant can be implanted through the first gate into the first channel region. Alternatively, the dopant can be implanted into the first gate but not the first channel region and then diffused from the first gate into the first channel region. Preferably, the dopant provides lightly doped source and drain regions for the first and second device regions, and essentially all depletion-mode doping for the first channel region. It is also preferred that the first gate is polysilicon and the second gate is amorphous silicon.

Advantageously, by using different gate materials, a single implant step can be used to provide lightly doped source/drain regions for the enhancement-mode and depletion-mode IGFETs as well as depletion-mode doping for channel regions of the depletion-mode IGFETs (with gates composed of the first gate material) while retaining enhancement-mode doping for channel regions of the enhancement-mode IGFETs (with gates composed of the second gate material).

These and other objects, features and advantages of the invention will be further described and more readily apparent from a review of the detailed description of the preferred embodiments which follows.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

In the drawings, depicted elements are not necessarily drawn to scale and like or similar elements may be designated by the same reference numeral throughout the several views.

Figure 1A:
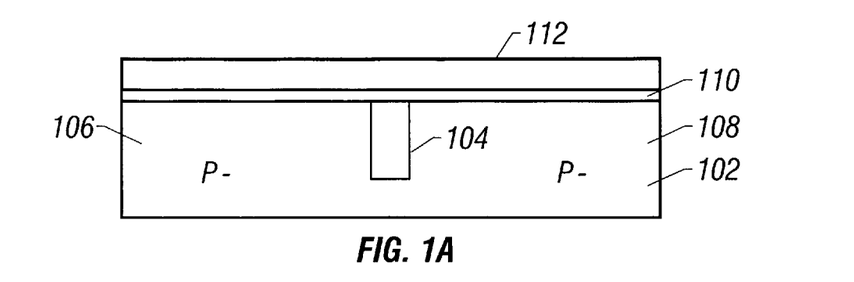
FIGS. 1A–1N show cross-sectional views of successive process steps for making enhancement-mode and depletion-mode IGFETs with different gate materials in accordance with a first embodiment of the invention.
Figure 1B:
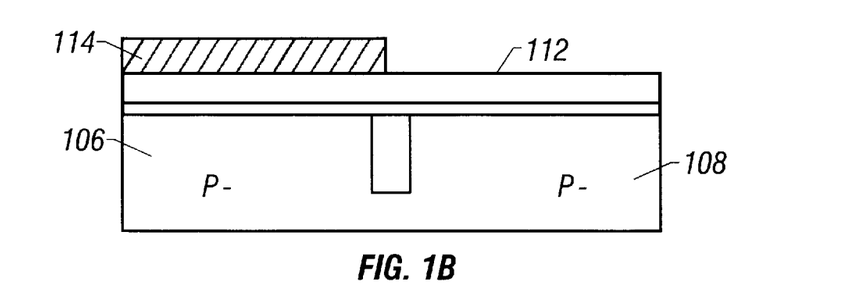
Figure 1C:
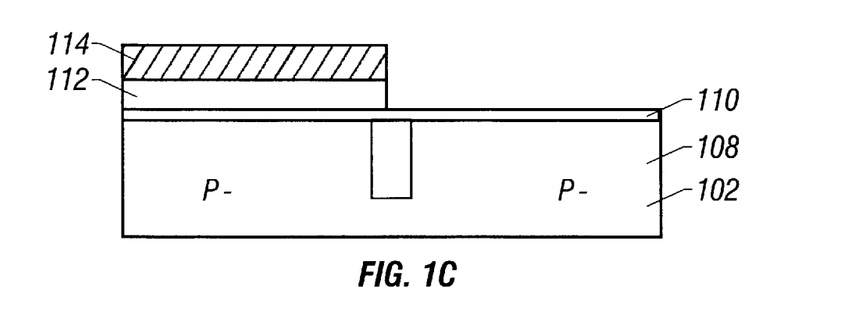
Figure 1D:
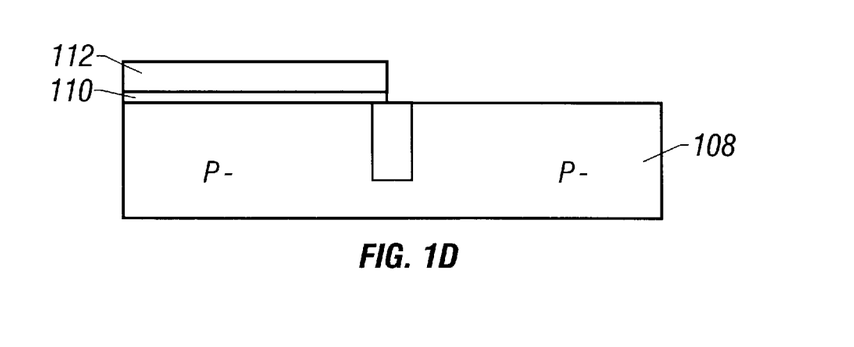
Figure 1E:
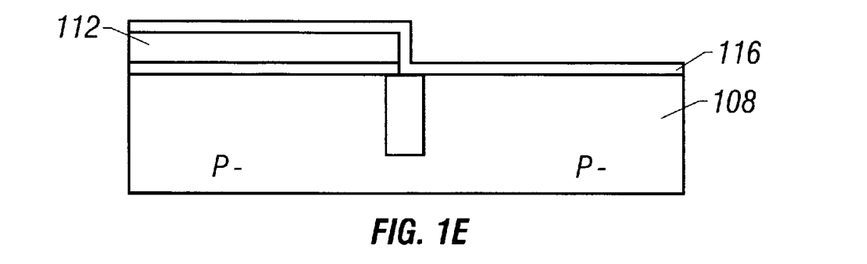
Figure 1F:
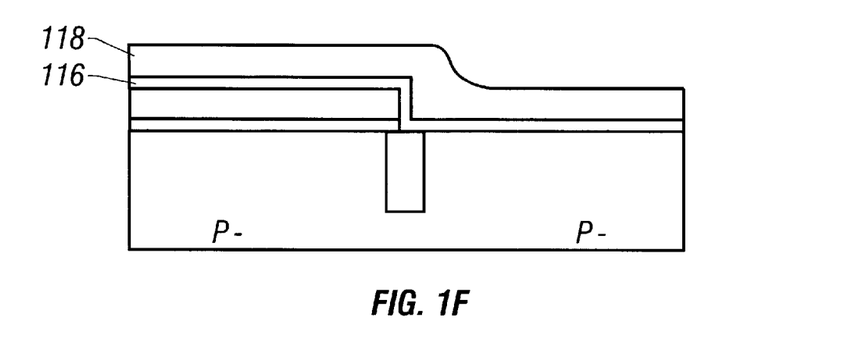
Figure 1G:
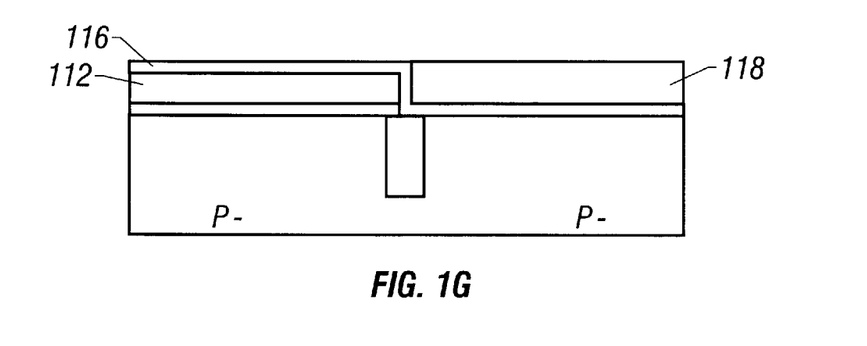
Figure 1H:
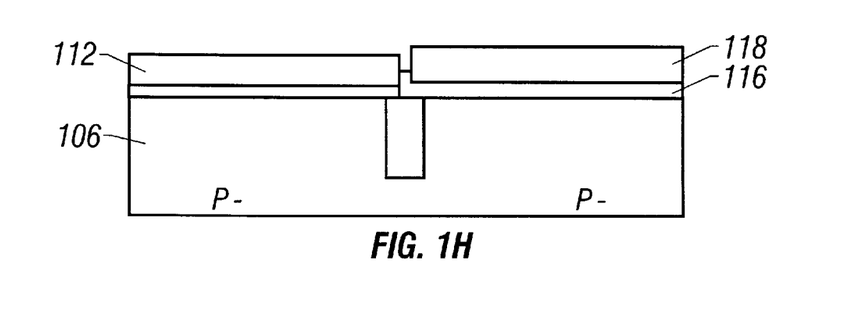
Figure 1I:
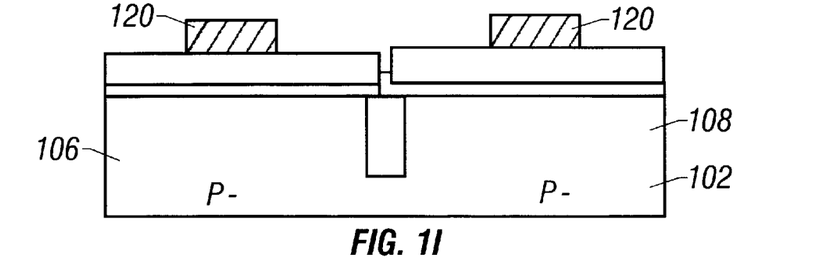
Figure 1J:
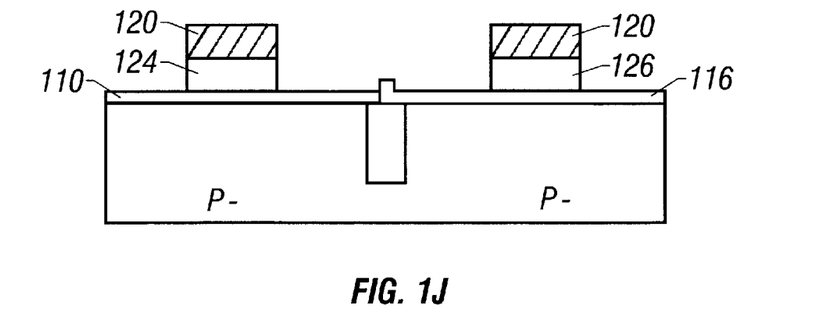
Figure 1K:
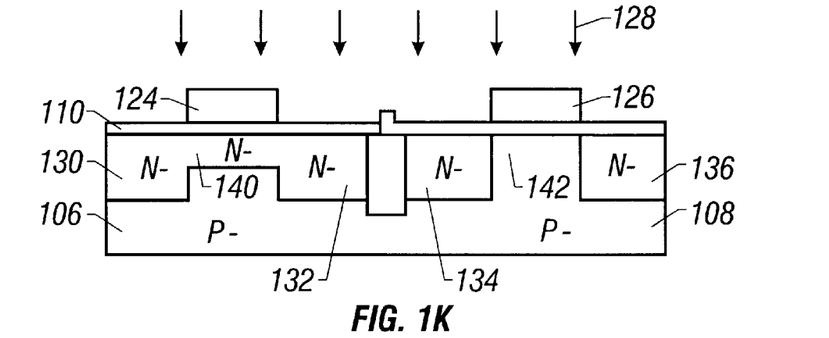
Figure 1L:
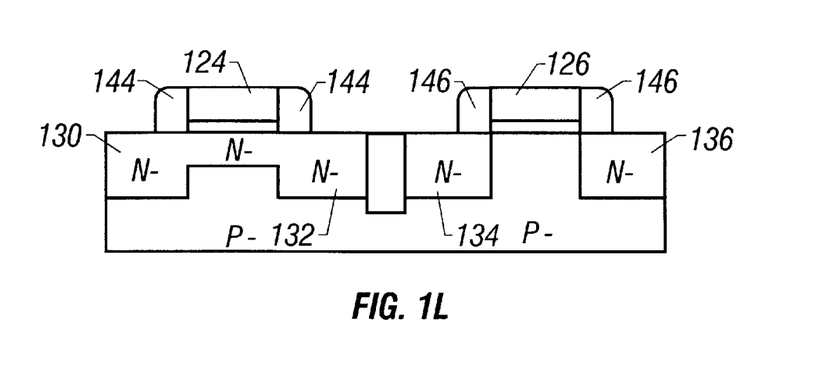
Figure 1M:
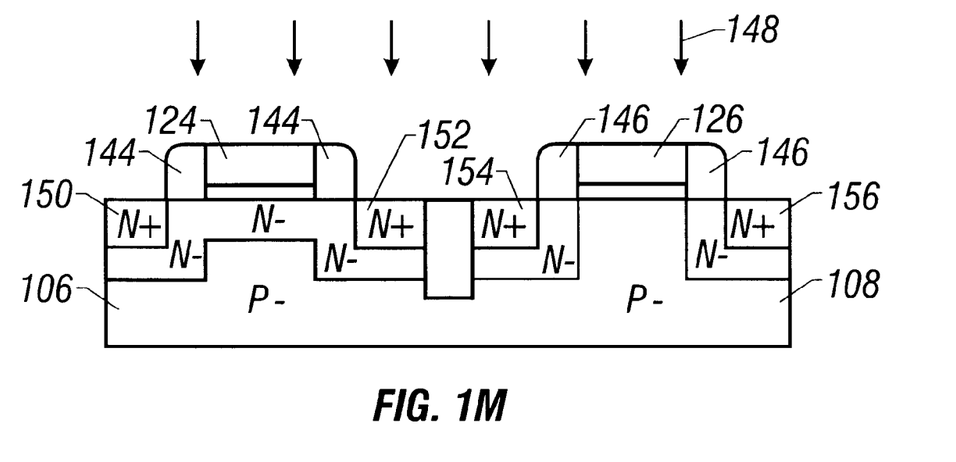
Figure 1N:
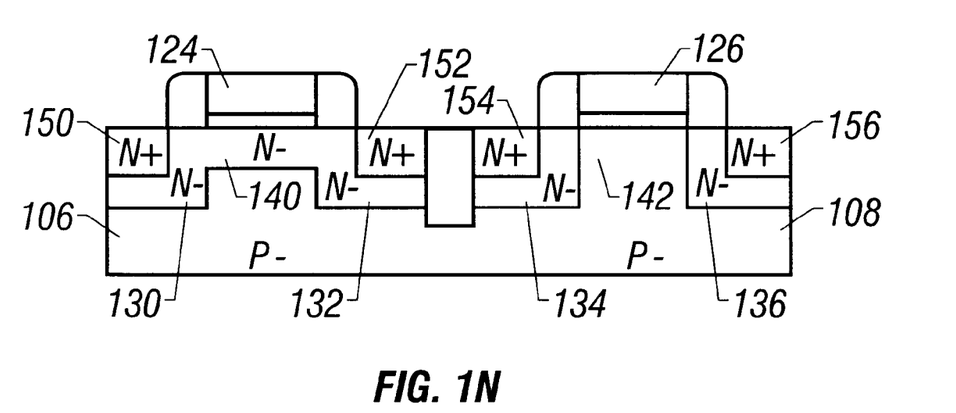

FIGS. 1A–1N show cross-sectional views of successive process steps for making enhancement-mode and depletion-mode IGFETs with different gate materials in accordance with a first embodiment of the invention.

In FIG. 1A, silicon substrate 102 suitable for integrated circuit manufacture is provided. Substrate 102 includes a P− type epitaxial surface layer with a planar top surface disposed on a P+ base layer (not shown). The epitaxial surface layer has a boron background concentration on the order of $1 \times 10^{16}$ atoms/cm$^3$, a <100> orientation and a resistivity of 12 ohm-cm. Trench oxide 104, composed of silicon dioxide (SiO$_2$), provides dielectric isolation between devices regions 106 and 108 in substrate 102. A blanket layer of gate oxide 110, composed of silicon dioxide, is formed on the top surface of substrate 102 using tube growth at a temperature of 700 to 1000° C. in an O$_2$ containing ambient. Gate oxide 110 has a thickness in the range of 30 to 100 angstroms. Thereafter, polysilicon layer 112 is deposited by low pressure chemical vapor deposition on the top surface of gate oxide 110. Polysilicon layer 112 is undoped and has a thickness of 1000 angstroms. If desired, polysilicon layer 112 can be doped in situ as deposition occurs, or doped immediately after deposition by implanting arsenic with a dosage in the range of $1 \times 10^{15}$ to $5 \times 10^{15}$ atoms/cm$^2$ and an energy in the range of 2 to 10 kiloelectron-volts. However, it is generally preferred that polysilicon layer 112 be initially doped during a later processing step.

In FIG. 1B, photoresist layer 114 is deposited on polysilicon layer 112. A photolithographic system, such as a step and repeat optical projection system which generates deep ultraviolet light from a mercury-vapor lamp, uses a first reticle to irradiate photoresist layer 114 with a first image pattern. Thereafter, the irradiated portions of photoresist layer 114 are removed, and photoresist layer 114 covers device region 106 and includes an opening above device region 108.

In FIG. 1C, an anisotropic dry etch is applied using photoresist layer 114 as an etch mask. Photoresist layer 114 protects the underlying region of polysilicon layer 112, and the etch removes the region of polysilicon layer 112 beneath the opening in photoresist layer 114. The etch is highly selective of polysilicon layer 112 with respect to gate oxide 110, so only a negligible amount of gate oxide 110 is removed and substrate 102 is unaffected. Since, however, the thickness of gate oxide 110 above device region 108 should be precisely controlled, it desirable to remove gate oxide 110 above device region 108 and replace it with another gate oxide.

In FIG. 1D, photoresist layer 114 is stripped, and a wet etch that includes hydrofluoric acid is applied. The wet etch is highly selective of silicon dioxide with respect to silicon and polysilicon, so gate oxide 110 above device region 108 is removed and only a negligible amount of polysilicon layer 112 and device region 108 is removed.

In FIG. 1E, gate oxide 116 is formed on the exposed surfaces of polysilicon layer 112 and device region 108 using tube growth at a temperature of 700 to 1000° C. in an O$_2$ containing ambient. Gate oxide 116 has a thickness in the range of 30 to 100 angstroms.

In FIG. 1F, amorphous silicon layer 118 is deposited by low pressure chemical vapor deposition on gate oxide 116. Preferably, amorphous silicon layer 118 is deposited at a temperature no greater than about 580° C. to prevent the deposition of polysilicon. Amorphous silicon layer 118 is undoped and has a thickness of 1000 angstroms. If desired, amorphous silicon layer 118 can be doped in situ as deposition occurs, or doped immediately after deposition by implanting arsenic with a dosage in the range of $1 \times 10^{15}$ to $5 \times 10^{15}$ atoms/cm$^2$ and an energy in the range of 2 to 10 kiloelectron-volts. However, it is generally preferred that amorphous silicon layer 118 be initially doped during a later processing step.

In FIG. 1G, the structure is planarized by applying chemical-mechanical polishing in the presence of an abrasive slurry that is highly selective of amorphous silicon with respect to silicon dioxide. The polishing grinds down amorphous silicon layer 118, and is discontinued using gate oxide 116 on polysilicon layer 112 as a stop-layer. After polishing occurs, the top surfaces of gate oxide 116 (on polysilicon layer 112) and amorphous silicon layer 118 are aligned and form a planar surface.

In FIG. 1H, a wet etch that includes hydrofluoric acid is applied. The wet etch is highly selective of silicon dioxide with respect to silicon and polysilicon, so gate oxide 116 over device region 106 is removed and only a negligible amount of polysilicon layer 112 and amorphous silicon layer 118 is removed.

In FIG. 1I, photoresist layer 120 is deposited over substrate 102. The photolithographic system uses a second reticle to irradiate photoresist layer 120 with a second image pattern. Thereafter, the irradiated portions of photoresist layer 120 are removed so that photoresist layer 120 includes openings above selected portions of device regions 106 and 108.

In FIG. 1J, a dry etch is applied using photoresist layer 120 as an etch mask. Photoresist layer 120 protects the underlying regions of polysilicon layer 112 and amorphous silicon layer 118, and the etch removes the regions of polysilicon layer 112 and amorphous silicon layer 118 beneath the openings in photoresist layer 120. The dry etch is highly selective of polysilicon and amorphous silicon with respect to silicon dioxide, so only a negligible amount of gate oxides 110 and 116 beneath the openings in photoresist layer 120 is removed. The etch forms polysilicon gate 124 from the unetched portion of polysilicon layer 112 over device region 106, and amorphous silicon gate 126 from the unetched portion of amorphous silicon layer 118 over device region 108. Gates 124 and 126 each have opposing vertical edges (or sidewalls) separated by a length of 3500 angstroms, and gate 126 is slightly thicker than gate 124.

In FIG. 1K, photoresist layer 120 is stripped, lightly doped source and drain regions are implanted into the device regions, and depletion-mode doping is provided for a channel region in one of the device regions (but not the other device region) by subjecting the structure to ion implantation of phosphorus, indicated by arrows 128, with little or no tilt, at a dose in the range of $1\times10^{13}$ to $5\times10^{14}$ atoms/cm² and an energy of 30 to 60 kiloelectron-volts. As a result, lightly doped source/drain regions 130 and 132 are implanted into device region 106 outside gate 124 and are self-aligned to the opposing vertical edges of gate 124, and lightly doped source/drain regions 134 and 136 are implanted into device region 108 outside gate 126 and are self-aligned to the opposing vertical edges of gate 126.

A phenomena called "channeling" occurs when the ion beam which implants the dopant is closely aligned with the crystal lattice of the silicon. When channeling occurs, the dopant is initially implanted deep beneath the top surface, but then as implantation continues the surface becomes amorphous and less channeling occurs. Thus, less channeling of implanted ions occurs in amorphous silicon than in polysilicon.

Since gate 124 is composed of polysilicon, gate 126 is composed of amorphous silicon, and the phosphorus indicated by arrows 128 is implanted with little or no tilt, more channeling occurs in gate 124 than in gate 126. Accordingly, a substantial amount of the phosphorus that impinges upon gate 124 transfers through gate 124 and gate oxide 110 and is implanted into channel region 140; however, essentially all of the phosphorus that impinges upon gate 126 is implanted into gate 126 and does not reach channel region 142. Therefore, the implant step provides depletion-mode doping for channel region 140 while retaining enhancement-mode doping for channel region 142 due to the difference in materials between gates 124 and 126.

Channel region 140 is in device region 106 beneath gate 124 and is adjacent to lightly doped source/drain regions 130 and 132, and channel region 142 is in device region 108 beneath gate 126 and is adjacent to lightly doped source/drain regions 134 and 136. Lightly doped source/drain regions 130, 132, 134 and 136 are doped N− with an phosphorus concentration in the range of about $1\times10^{17}$ to $1\times10^{18}$ atoms/cm³, channel region 140 is doped N− with an phosphorus concentration in the range of about $5\times10^{16}$ to $5\times10^{17}$ atoms/cm³, and channel region 142 continues to be doped P− with a boron concentration of about $1\times10^{16}$ atoms/cm³. Preferably, the phosphorus concentration in channel region 140 is substantially less than that of lightly doped source/drain regions 130 and 132.

In FIG. 1L, an oxide layer with a thickness of 1000 angstroms is conformally deposited over the exposed surfaces by plasma enhanced chemical vapor deposition at a temperature in the range of 300 to 450° C. Thereafter, the structure is subjected to an anisotropic reactive ion etch that forms oxide spacers 144 adjacent to the opposing vertical edges of gate 124 and oxide spacers 146 adjacent to the opposing vertical edges of gate 126. Spacers 144 cover portions of lightly doped source/drain regions 130 and 132, and spacers 146 cover portions of lightly doped source/drain regions 134 and 136.

In FIG. 1M, heavily doped source and drain regions are implanted into the device regions by subjecting the structure to ion implantation of arsenic, indicated by arrows 148, at a dose in the range of $1\times10^{15}$ to $5\times10^{15}$ atoms/cm² and an energy of 5 kiloelectron-volts, using gate 124 and spacers 144 as an implant mask for device region 106, and using gate 126 and spacers 146 as an implant mask for device region 108. As a result, heavily doped source/drain regions 150 and 152 are implanted in device region 106 and are self-aligned to the outside edges of spacers 144, and heavily doped source/drain regions 154 and 156 are implanted in device region 108 and are self-aligned to the outside edges of spacers 146. Heavily doped source/drain regions 150, 152, 154 and 156 are doped N+ with an arsenic concentration in the range of about $1\times10^{18}$ to $1\times10^{20}$ atoms/cm³.

In FIG. 1N, the device is annealed to remove crystalline damage and to drive-in and activate the implanted dopants by applying a rapid thermal anneal on the order of 950 to 1050° C. for 10 to 30 seconds. Source regions 130 and 150 form a source and drain regions 132 and 152 form a drain for a depletion-mode N-channel IGFET in device region 106. Similarly, source regions 134 and 154 form a source and drain regions 136 and 156 form a drain for an enhancement-mode N-channel IGFET in device region 108. Since the dopants diffuse both vertically and laterally, the lightly doped source and drain regions extend slightly beneath the gates, and the heavily doped source and drain regions extend slightly beneath the spacers. In addition, the anneal may cause some recrystallization of the amorphous silicon into polycrystalline grains. Of importance, little or no phosphorus or arsenic diffuses from gate 124 into channel region 140, or from gate 126 into channel region 142. Therefore, essentially all depletion-mode doping for channel region 140 is provided by phosphorus, indicated by arrows 128, during a single implant step that also provides the lightly doped source/drain regions. In this manner, the polysilicon gate provides for a depletion-mode device and the amorphous silicon gate provides for an enhancement-mode device.

Figure 2A:
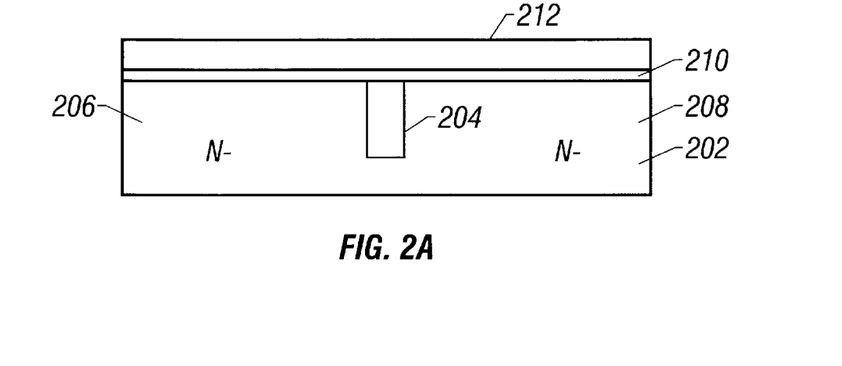
FIGS. 2A–2O show cross-sectional views of successive process steps for making enhancement-mode and depletion-mode IGFETs with different gate materials in accordance with a second embodiment of the invention.
Figure 2B:
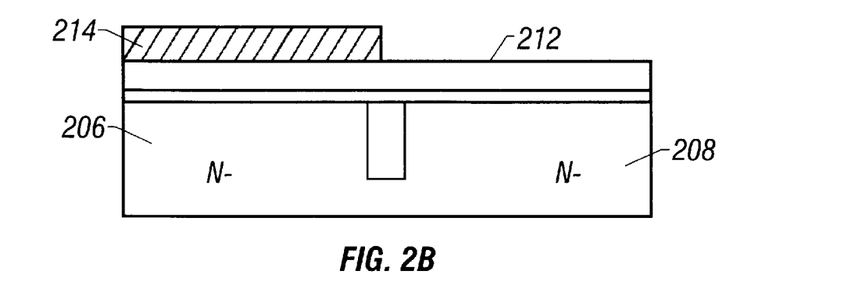
Figure 2C:
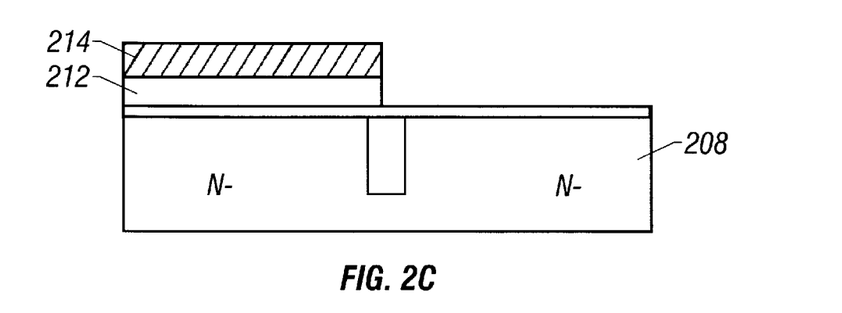
Figure 2D:
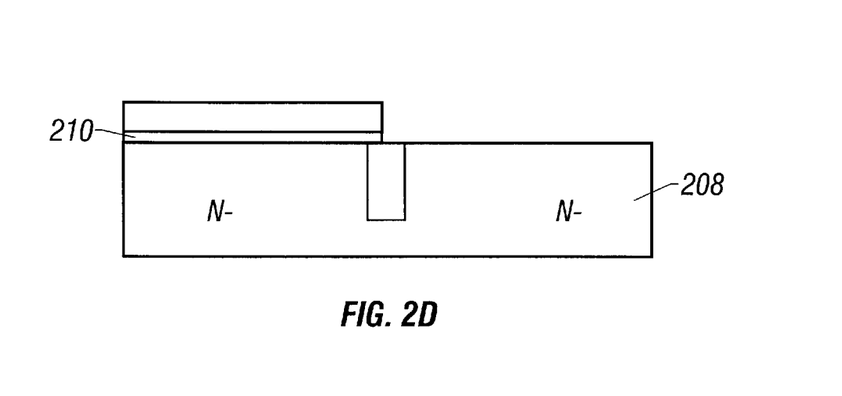
Figure 2E:
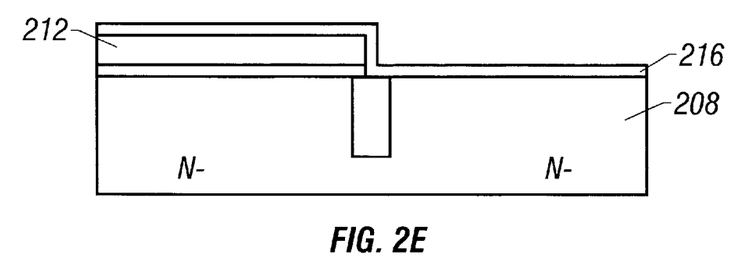
Figure 2F:
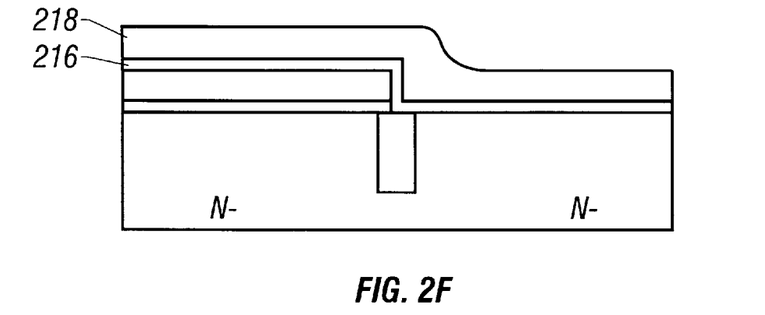
Figure 2G:
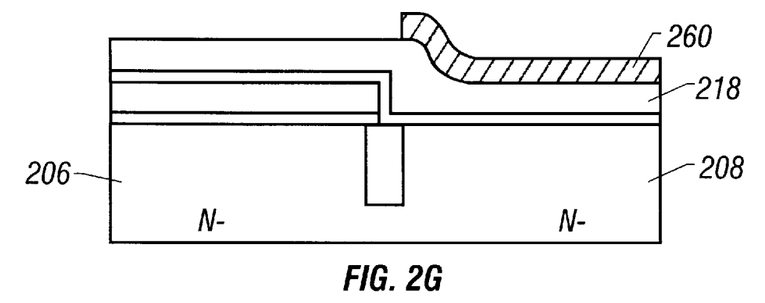
Figure 2H:
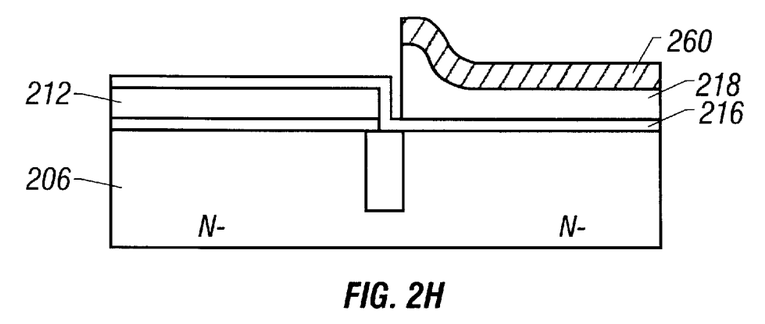
Figure 2I:
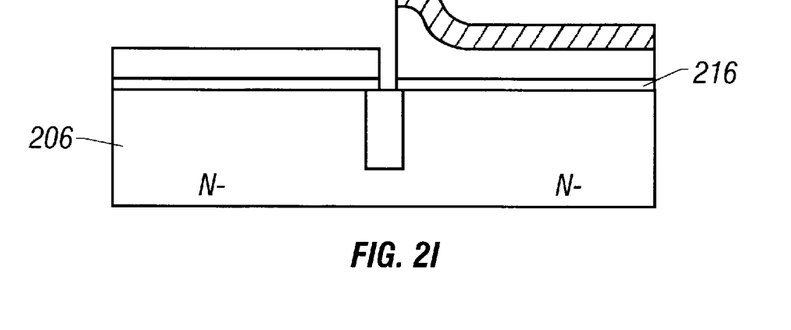
Figure 2J:
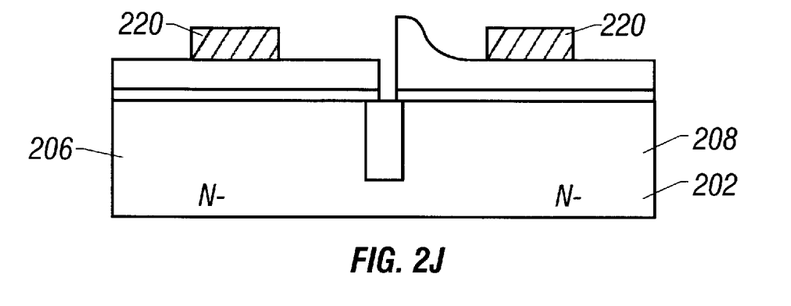
Figure 2K:
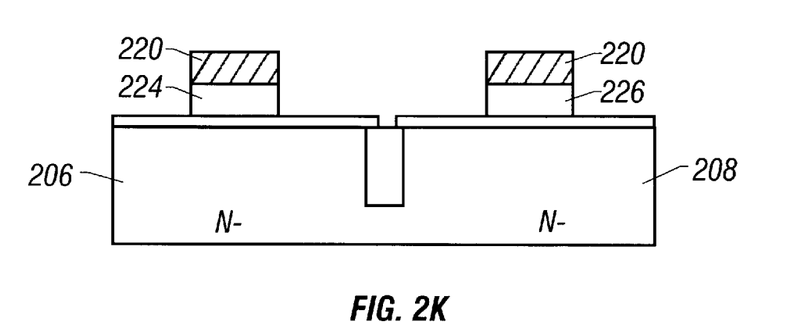
Figure 2L:
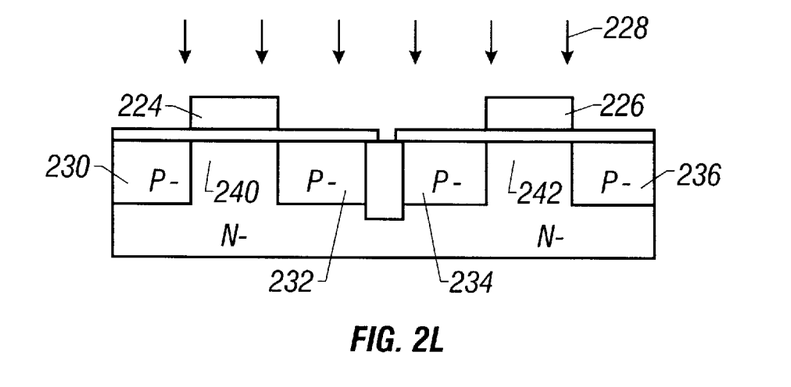
Figure 2M:
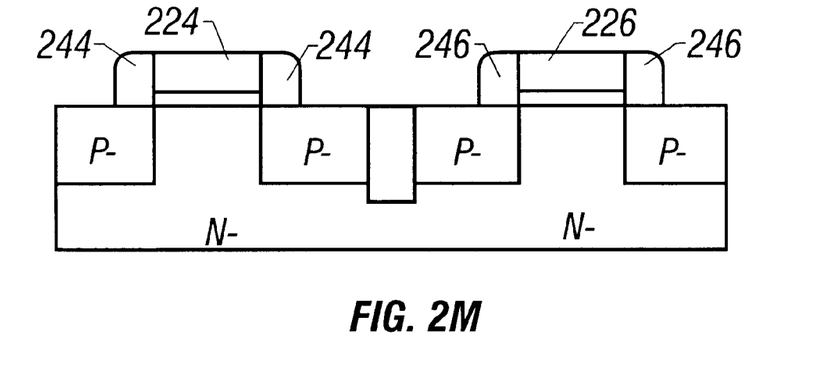
Figure 2N:
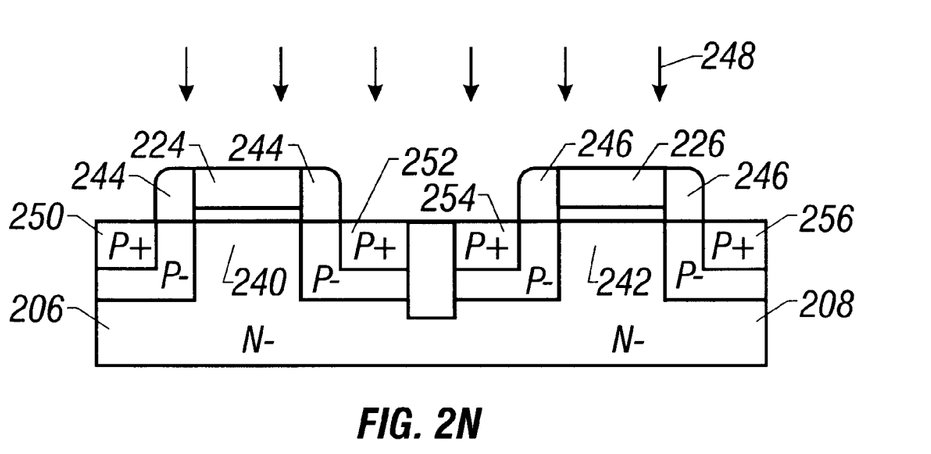
Figure 2O:
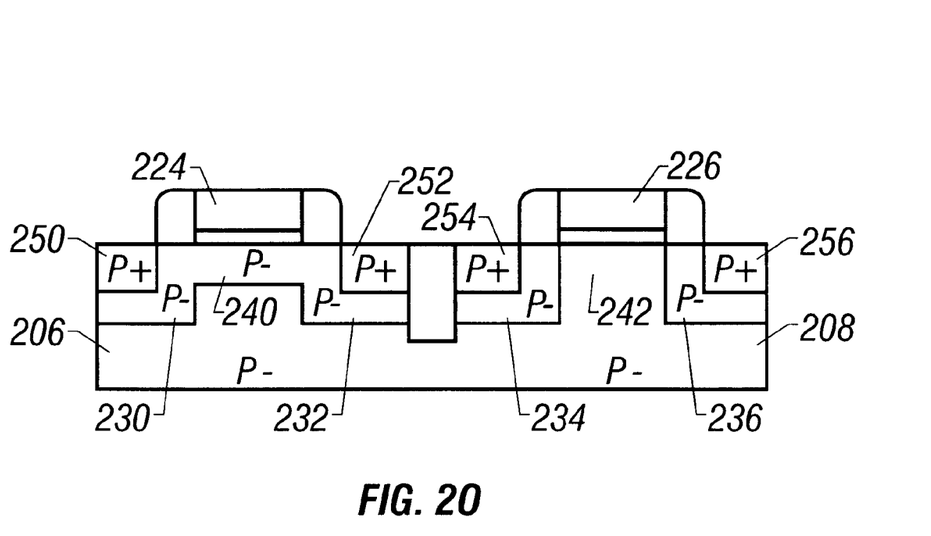

FIGS. 2A–2O show cross-sectional views of successive process steps for forming enhancement-mode and depletion-mode IGFETs with different gate materials in accordance with a second embodiment of the invention. The primary difference between the first and second embodiments is that in the first embodiment, the depletion-mode doping is implanted through the polysilicon gate into the underlying channel region, whereas in the second embodiment, the depletion-mode doping is diffused from the polysilicon gate into the underlying channel region. Another difference is that in the first embodiment the amorphous silicon above the polysilicon is removed by polishing, whereas in the second embodiment the amorphous silicon above the polysilicon is removed by photolithography and etching. Still another difference is that the conductivity types are reversed. Unless otherwise noted, the elements for the second embodiment (e.g., substrate 202, gate oxide 210, etc.) are similar to elements of the first embodiment (e.g., substrate 102, gate oxide 110, etc.), and the description of related elements and process steps need not be repeated.

In FIG. 2A, silicon substrate 202 suitable for integrated circuit manufacture is provided. Substrate 202 includes an N− type well (shown) with a planar top surface. The N-well is in a P− type epitaxial surface layer (not shown) disposed on a P+ base layer (not shown). The N-well has a phosphorus background concentration on the order of $1 \times 10^{16}$ atoms/cm$^3$, a <100> orientation and a resistivity of 12 ohm-cm. Trench oxide 204 provides dielectric isolation between devices regions 206 and 208 in substrate 202. A blanket layer of gate oxide 210 with a thickness in the range of 30 to 100 angstroms is grown on substrate 202. Thereafter, polysilicon layer 212 with a thickness of 1000 angstroms is deposited on gate oxide 210.

In FIG. 2B, photoresist layer 214 is deposited on polysilicon layer 212. A photolithographic system uses a first reticle to irradiate photoresist layer 214 with a first image pattern. Thereafter, the irradiated portions of photoresist layer 214 are removed, and photoresist layer 214 covers device region 206 and includes an opening above device region 208.

In FIG. 2C, an anisotropic dry etch is applied using photoresist layer 214 as an etch mask. The etch removes the region of polysilicon layer 212 above device region 208.

In FIG. 2D, photoresist layer 214 is stripped, and a wet etch that includes hydrofluoric acid is applied that removes gate oxide 210 above device region 208.

In FIG. 2E, gate oxide 216 is grown formed on the exposed surfaces of polysilicon layer 212 and device region 208. Gate oxide 216 has a thickness in the range of 30 to 100 angstroms.

In FIG. 2F, amorphous silicon layer 218 is deposited on gate oxide 216.

In FIG. 2G, photoresist layer 260 is deposited on amorphous silicon layer 218. The photolithographic system uses a second reticle to irradiate photoresist layer 260 with a second image pattern. Thereafter, the irradiated portions of photoresist layer 260 are removed, and photoresist layer 260 covers device region 208 and includes an opening above device region 206.

In FIG. 2H, an anisotropic etch is applied using photoresist layer 260 as an etch mask. Photoresist layer 260 protects the underlying region of amorphous silicon layer 218, and the etch removes the region of amorphous silicon layer 218 beneath the opening in photoresist layer 260. The etch is highly selective of amorphous silicon layer 218 with respect to gate oxide 216, so only a negligible amount of gate oxide 216 is removed and polysilicon layer 212 is unaffected. Accordingly, amorphous silicon layer 218 above device region 206 is removed, and polysilicon layer 212 above device region 206 remains intact.

In FIG. 2I, a wet chemical etch that includes hydrofluoric acid is applied that removes gate oxide 216 above device region 206.

In FIG. 2J, photoresist layer 220 is deposited over substrate 202. The photolithographic system uses a third reticle to irradiate photoresist layer 220 with a third image pattern. Thereafter, the irradiated portions of photoresist layer 220 are removed, and photoresist layer 220 includes openings above selected portions of device regions 206 and 208.

In FIG. 2K, an anisotropic dry etch is applied using photoresist layer 220 as an etch mask. The etch forms polysilicon gate 224 from the unetched portion of polysilicon layer 212 over device region 206, and amorphous silicon gate 226 from the unetched portion of amorphous silicon layer 218 over device region 208.

In FIG. 2L, photoresist layer 220 is stripped, and lightly doped source and drain regions are implanted into the device regions, without providing depletion-mode doping for any channel regions, by subjecting the structure to ion implantation of boron, indicated by arrows 228, at a dose in the range of $1 \times 10^{13}$ to $5 \times 10^{14}$ atoms/cm$^2$ and an energy of 10 to 15 kiloelectron-volts. As a result, lightly doped source/drain regions 230 and 232 are implanted into device region 206 outside gate 224 and are self-aligned to the opposing vertical edges of gate 224, and lightly doped source/drain regions 234 and 236 are implanted into device region 208 outside gate 226 and are self-aligned to the opposing vertical edges of gate 226. Essentially all of the boron that impinges upon gates 224 and 226 is implanted into gates 224 and 226 without being implanted into the underlying channel regions 240 and 242. Therefore, enhancement-mode doping is retained for channel regions 240 and 242. Lightly doped source/drain regions 230, 232, 234 and 236 are doped P− with a boron concentration in the range of about $1 \times 10^{17}$ to $1 \times 10^{18}$ atoms/cm$^3$, and channel regions 240 and 242 continue to be doped N− with a phosphorus concentration of about $1 \times 10^{16}$ atoms/cm$^3$.

In FIG. 2M, an oxide layer with a thickness of 1000 angstroms is conformally deposited over the exposed surfaces, and then the structure is subjected to an anisotropic reactive ion etch that forms oxide spacers 244 adjacent to the opposing vertical edges of gate 224 and oxide spacers 246 adjacent to the opposing vertical edges of gate 226.

In FIG. 2N, heavily doped source and drain regions are implanted into the device regions by subjecting the structure to ion implantation of boron, indicated by arrows 248, at a dose in the range of $1 \times 10^{15}$ to $5 \times 10^{15}$ atoms/cm$^2$ and an energy of 5 kiloelectron-volts, using gate 224 and spacers 244 as an implant mask for device region 206, and using gate 226 and spacers 246 as an implant mask for device region 208. As a result, heavily doped source/drain regions 250 and 252 are implanted in device region 206 and are self-aligned to the outside edges of spacers 244, and heavily doped source/drain regions 254 and 256 are implanted in device region 208 and are self-aligned to the outside edges of spacers 246. Furthermore, channel regions 240 and 242 retain enhancement-mode doping. Heavily doped source/drain regions 250, 252, 254 and 256 are doped P+ with a boron concentration in the range of about $1 \times 10^{18}$ to $1 \times 10^{20}$ atoms/cm$^3$.

In FIG. 2O, the device is annealed to remove crystalline damage and to drive-in and activate the implanted dopants, and to provide depletion-mode doping in one of the channel regions (but not the other channel region) by applying a rapid thermal anneal on the order of 950 to 1050° C. for 10 to 30 seconds.

In polysilicon, the diffusion constants at the grain boundaries are significantly higher than those in the single crystal regions. Thus, the dopants are capable of diffusing much more rapidly along the grain boundaries than through crystallites. Furthermore, the grain boundaries in polysilicon tend to be much larger than those in amorphous silicon, leading to more rapid dopant diffusion through polysilicon than through amorphous silicon.

Since gate 224 is composed of polysilicon, gate 226 is composed of amorphous silicon, and boron diffuses far more rapidly through polysilicon than through amorphous silicon, the boron in gate 224 diffuses far more rapidly than the boron in gate 226, although the anneal may cause some recrystallization of the amorphous silicon into polycrystalline grains.

The boron indicated by arrows 248 has been implanted into gates 224 and 226 with a sufficiently shallow depth that essentially none of it diffuses through gate oxides 210 and 216 into channel regions 240 and 242, respectively. Furthermore, essentially none of the boron indicated by arrows 228 that has been implanted into gate 226 diffuses from gate 226 to channel region 242. However, a substantial amount of the boron indicated by arrows 228 that has been implanted into gate 224 diffuses from gate 224 into channel region 240. As a result, depletion-mode doping is provided for channel region 240, and enhancement-mode doping is retained for channel region 242.

Channel region 240 is doped P− with a boron concentration in the range of about $5\times10^{16}$ to $5\times10^{17}$ atoms/cm$^3$, and channel region 242 continues to be doped N− with a phosphorus concentration of about $1\times10^{16}$ atoms/cm$^3$. Preferably, the boron concentration in channel region 240 is substantially less than that of lightly doped source/drain regions 230 and 232. Furthermore, source regions 230 and 250 form a source and drain regions 232 and 252 form a drain for a depletion-mode P-channel IGFET in device region 206, and similarly, source regions 234 and 254 form a source and drain regions 236 and 256 form a drain for an enhancement-mode P-channel IGFET in device region 208. In addition, the lightly doped source and drain regions extend slightly beneath the gates, and the heavily doped source and drain regions extend slightly beneath the spacers.

Thus, essentially all depletion-mode doping for channel region 240 is provided by boron, indicated by arrows 228, from a single implant step that also provides the lightly doped source/drain regions, by way of diffusion of the implanted boron from the overlying gate. In this manner, the polysilicon gate provides for a depletion-mode device and the amorphous silicon gate provides for an enhancement-mode device.

Further processing steps in the fabrication of IGFETs typically include forming salicide contacts on the gates, sources and drains, forming a thick oxide layer over the device regions, forming contact windows in the oxide layer to expose the salicide contacts, forming interconnect metallization in the contact windows, and forming a passivation layer over the metallization. In addition, earlier or subsequent high-temperature process steps can be used to supplement or replace the anneal step to provide the desired anneal, activation, and drive-in functions. These further processing steps are conventional and need not be repeated herein. Likewise the principal processing steps disclosed herein may be combined with other steps apparent to those skilled in the art.

The present invention includes numerous variations to the embodiments described above. For instance, suitable gate materials include polysilicon, amorphous silicon, titanium, titanium-based compounds such as titanium nitride and titanium silicide, cobalt, and cobalt-based compounds such as cobalt silicide. The order in which the gate materials are deposited can be reversed. The gate insulator and spacers can be various dielectrics such as silicon dioxide, silicon nitride and silicon oxynitride. If desired, a single insulative layer can provide the gate insulator for both the enhancement-mode and depletion-mode devices. The device regions can be isolated using various techniques such as LOCOS oxidation, or alternatively need not be isolated from one another. The photoresist layers can pattern other masking layers to be used as an etch mask and/or implant mask. The depletion-mode doping can be provided by a combination of implantation and diffusion through a gate, or by a combination of several implant steps such as a first implant step that forms lightly doped source/drain regions and a second implant step that forms heavily doped source/drain regions, or by a single implant step that forms heavily doped source/drain regions before or after the lightly doped source/drain regions are formed, or by a single implant step that provides all source/drain doping. Suitable N-type dopants include arsenic and phosphorus (although it may be difficult to diffuse any appreciable amount of arsenic or phosphorus through the gate insulator); suitable P-type dopants include boron $B_{10}$, boron $B_{11}$, and $BF_X$ species such as $BF_2$.

Furthermore, the present invention can be used to provide enhancement-mode IGFETs with different threshold voltages as well as depletion-mode IGFETs with different threshold voltages. In both instances, the difference in threshold voltages is due to the different gate materials.

The invention is particularly well-suited for fabricating N-channel MOSFETs, P-channel MOSFETs and other types of IGFETs, particularly for high-performance microprocessors where high circuit density is essential. Although a single pair of enhancement-mode and depletion-mode devices has been shown for purposes of illustration, it is understood that in actual practice, many devices are fabricated on a single semiconductor wafer as widely practiced in the art. Accordingly, the invention is well-suited for use in an integrated circuit chip, as well as an electronic system including a microprocessor, a memory and a system bus.

Those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims.

What is claimed is:

1. A method of making enhancement-mode and depletion-mode IGFETs, comprising the steps of:

providing a semiconductor substrate with first and second device regions;

forming a first gate composed of a first gate material over the first device region;

forming a second gate composed of a second gate material over the second device region, wherein the first and second gate materials are different;

implanting a dopant into the substrate and into the first and second gates to implant source and drain regions in the first device region and source and drain regions in the second device region; and transferring the dopant through the first gate into a first channel region in the first device region beneath the first gate without transferring essentially any of the dopant through the second gate into a second channel region in the second device region beneath the second gate, thereby providing depletion-mode doping in the first channel region while retaining enhancement-mode doping in the second channel region.

2. The method of claim 1, wherein implanting the dopant into the substrate includes implanting the dopant through the first gate into the first channel region, thereby transferring the dopant through the first gate into the first channel region.

3. The method of claim 1, wherein implanting the dopant into the substrate excludes implanting essentially any of the dopant through the first gate into the first channel region, and transferring the dopant through the first gate into the first channel region includes applying heat to diffuse the dopant from the first gate into the first channel region.

4. The method of claim 1, wherein forming the first and second gates includes depositing the first gate material over the first and second device regions, removing the first gate material over the second device region, depositing the second gate material over first and second device regions, removing the second gate material over the first device region, and then removing selected portions of the first gate material over the first device region and removing selected portions of the second gate material over the second device region.

5. The method of claim 4, including forming an insulating layer over the first gate material and over the second device region after removing the first gate material over the second device region and before depositing the second gate material over the first and second device regions.

6. The method of claim 1, wherein the dopant provides essentially all depletion-mode doping for the first channel region.

7. The method of claim 1, wherein the source and drain regions in the first device region are substantially aligned with opposing sidewalls of the first gate, and the source and drain regions in the second device region are substantially aligned with opposing sidewalls of the second gate.

8. The method of claim 1, wherein the first gate material is selected from the group consisting of polysilicon and amorphous silicon, the second gate material is selected from the group consisting of polysilicon, titanium, titanium-based compounds, cobalt, and cobalt-based compounds.

9. A method of making enhancement-mode and depletion-mode IGFETs, comprising the steps of:
providing a semiconductor substrate with first and second device regions;
forming a first gate insulator on the first device region;
forming a second gate insulator on the second device region;
forming a first gate composed of a first gate material on the first gate insulator;
forming a second gate composed of a second gate material on the gate insulator;
implanting a dopant into the first and second gates, into the first device region outside the first gate, and into the second device region outside the second gate, to implant source and drain regions in the first device region outside the first gate and to implant source and drain regions in the second device region outside the second gate; and
transferring the dopant through the first gate into a first channel region in the first device region beneath the first gate without transferring essentially any of the dopant through the second gate into a second channel region in the second device region beneath the second gate, thereby providing depletion-mode doping in the first channel region while retaining enhancement-mode doping in the second channel region due to a difference in composition between the first and second gate materials.

10. The method of claim 9, wherein implanting the dopant into the substrate includes implanting the dopant through the first gate into the first channel region, thereby transferring the dopant through the first gate into the first channel region and providing essentially all depletion-mode doping for the first channel region.

11. The method of claim 9, wherein implanting the dopant into the substrate excludes implanting essentially any of the dopant through the first gate into the first channel region, and transferring the dopant through the first gate into the first channel region includes applying heat to diffuse the dopant from the first gate into the first channel region to provide essentially all depletion-mode doping for the first channel region.

12. The method of claim 9, wherein transferring the dopant through the first gate into the first channel region includes implanting the dopant through the first gate into the first channel region and then diffusing the dopant from the first gate into the first channel region to provide essentially all depletion-mode doping for the first channel region.

13. The method of claim 9, including:
depositing the first gate material over the first and second device regions;
removing a portion of the first gate material over the second device region;
depositing the second gate material over the first and second device regions;
removing a portion of the second gate material over the first device region;
removing selected portions of the first gate material over first device region to form the first gate; and
removing selected portions of the second gate material over the second device region to form the second gate.

14. The method of claim 13, including depositing the first and second gate materials in sequence, removing the portions of the first and second gate materials in sequence, and removing the selected portions of the first and second gate materials simultaneously.

15. The method of claim 14, including:
forming an etch mask that covers the first gate material over the first device region and includes an opening above the first gate material over the second device region;
removing the portion of the first gate material by applying an etch through the opening in the etch mask;
stripping the etch mask; and then
removing the portion of the second gate material by applying polishing.

16. The method of claim 14, including:
forming an etch mask that covers the second gate material over the second device region and includes an opening above the second gate material over the first device region;
removing the portion of the second gate material by applying an etch through the opening in the etch mask;
stripping the etch mask; and then
removing the portion of the first gate material by applying polishing.

17. The method of claim 14, including:

forming a first etch mask that covers the first gate material over the first device region and includes an opening above the first gate material over the second device region;

removing the portion of the first gate material by applying an etch through the opening in the first etch mask;

stripping the first etch mask; and then forming a second etch mask that covers the second gate material over the second device region and includes an opening above the second gate material over the first device region;

removing the portion of the second gate material by applying an etch through the opening in the second etch mask; and stripping the second etch mask.

18. The method of claim 14, including:

forming a first etch mask that covers the second gate material over the second device region and includes an opening above the second gate material over the first device region;

removing the portion of the second gate material by applying an etch through the opening in the first etch mask;

stripping the first etch mask; and then forming a second etch mask that covers the first gate material over the first device region and includes an opening above the first gate material over the second device region;

removing the portion of the first gate material by applying an etch through the opening in the second etch mask; and stripping the second etch mask.

19. The method of claim 13, including forming the first and second gate insulators simultaneously.

20. The method of claim 19, including:

growing an insulating layer that includes the first and second gate insulators;

depositing the first gate material on the insulating layer; and depositing the second gate material on the insulating layer gate.

21. The method of claim 13, including forming the first and second gate insulators in sequence.

22. The method of claim 21, including:

growing a first insulating layer on the first and second device regions to form the first gate insulator on the first device region and a sacrificial insulator on the second device region;

depositing the first gate material on the first gate insulator and the sacrificial insulator;

removing the portion of the first gate material thereby exposing the sacrificial insulator;

removing the sacrificial insulator;

growing a second insulating layer on the first gate material over the first device region and on the second device region to form the second gate insulator on the second device region; and depositing the second gate material on the second insulating layer.

23. The method of claim 21, including:

growing a first insulating layer on the first and second device regions to form the second gate insulator on the second device region and a sacrificial insulator on the first device region;

depositing the second gate material on the second gate insulator and the sacrificial insulator;

removing the portion of the second gate material thereby exposing the sacrificial insulator;

removing the sacrificial insulator;

growing a second insulating layer on the second gate material over the second device region and on the first device region to form the first gate insulator on the first device region; and depositing the first gate material on the second insulating layer.

24. The method of claim 9, including:

forming first spacers adjacent to opposing vertical edges of the first gate and second spacers adjacent to opposing vertical edges of the second gate after implanting the source and drain regions as lightly doped source and drain regions; and implanting a second dopant into the first and second gates and into the substrate to implant heavily doped source and drain regions in the first device region outside the first gate and first spacers and to implant heavily doped source and drain regions in the second device region outside the second gate and second spacers.

25. The method of claim 24, wherein implanting the second dopant into the first and second gates excludes implanting essentially any of the second dopant through the first gate into the first channel region and excludes implanting essentially any of the second dopant through the second gate into the second channel region.

26. The method of claim 24, wherein transferring the dopant from the first gate into the first channel region occurs after implanting the second dopant, excludes transferring essentially any of the second dopant from the first gate into the first channel region, and excludes transferring essentially any of the second dopant from the second gate into the second channel region.

27. The method of claim 9, wherein the first and second gate materials have essentially identical thicknesses.

28. The method of claim 9, wherein the first gate material is polysilicon and the second gate material is amorphous silicon.

29. A method of making enhancement-mode and depletion-mode IGFETs, comprising the steps of providing a semiconductor substrate with first and second device regions of first conductivity type;

forming a first gate insulator on the first device region and forming a second gate insulator on the second device region in sequence;

depositing a first gate material on first gate insulator and depositing a second gate material on the second gate insulator in sequence;

etching the first and second gate materials simultaneously to form first and second gates from unetched portions of the first and second gate materials, respectively, over the first and second device regions, respectively;

implanting a first dopant of second conductivity type into the first and second gates, into the first device region outside the first gate, and into the second device region outside the second gate, without implanting essentially any of the first dopant through the first gate, and without implanting essentially any of the first dopant through the second gate, to form lightly doped first source and drain regions of second conductivity type in the first device region, to form a first channel region of first conductivity type in the first device region beneath the first gate and adjacent to the first lightly doped source and drain regions, to form second lightly doped source and drain regions of second conductivity type in the second device region, and to form a second channel region of first conductivity type in the second device region beneath the second gate and adjacent to the second lightly doped source and drain regions, thereby providing enhancement-mode doping of first conductivity type for the first and second channel regions;

forming first spacers adjacent to opposing sidewalls of the first gate and second spacers adjacent to opposing sidewalls of the second gate;

implanting a second dopant of second conductivity type into the first and second gates, into the first device region outside the first gate and first spacers, and into the second device region outside the second gate and second spacers, without implanting essentially any of the second dopant through the first gate, and without implanting essentially any of the second dopant through the second gate, to form first heavily doped source and drain regions of second conductivity type in the first device region, and to form second heavily doped source and drain regions of second conductivity type in the second device region; and applying heat to drive-in and activate the first dopant and to diffuse a substantial amount of the first dopant from the first gate into the first channel region without diffusing essentially any of the first dopant from the second gate into the second channel region, thereby providing the first channel region with depletion-mode doping of second conductivity type while the second channel region retains enhancement-mode doping due to a difference in composition between the first and second gate materials.

30. The method of claim 29, wherein the first dopant provides essentially all depletion-mode doping for the first channel region.

31. The method of claim 29, including applying heat to drive-in and activate the second dopant without diffusing essentially any of the second dopant from the first gate into the first channel region and without diffusing essentially any of the second dopant from the second gate into the second channel region.

32. The method of claim 29, wherein the first and second gate materials are deposited by chemical vapor deposition as layers with essentially identical thicknesses.

33. The method of claim 29, wherein the first gate material is polysilicon and the second gate material is amorphous silicon.

34. A method of making IGFETs with different threshold voltages, comprising the steps of:

providing a semiconductor substrate with first and second device regions;

forming a first gate composed of a first gate material over the first device region;

forming a second gate composed of a second gate material over the second device region, wherein the first and second gate materials have different compositions;

implanting a dopant into the substrate and into the first and second gates to implant source and drain regions in the first device region and source and drain regions in the second device region; and transferring a first amount of the dopant through the first gate into a first channel region in the first device region beneath the first gate and transferring a second amount of the dopant through the second gate into a second channel region in the second device region beneath the second gate, wherein the first amount is greater than the second amount, thereby providing a lower threshold voltage for the first channel region than the second channel region due to a difference between the first and second gate materials.

35. The method of claim 34, wherein implanting the dopant includes transferring the dopant.

36. The method of claim 34, wherein transferring the dopant includes applying heat to diffuse the dopant after implanting the dopant.

37. The method of claim 34, including depositing the first and second gate materials in sequence, and etching the first and second gate materials simultaneously to form the first and second gates.

38. The method of claim 34, wherein the first gate material is polysilicon and the second gate material is amorphous silicon.

* * * * *